(12) United States Patent
Sudo

(10) Patent No.: US 12,271,222 B2
(45) Date of Patent: Apr. 8, 2025

(54) REAL-TIME CLOCK MODULE AND ELECTRONIC DEVICE

(71) Applicant: SEIKO EPSON CORPORATION, Tokyo (JP)

(72) Inventor: Yasuhiro Sudo, Chino (JP)

(73) Assignee: SEIKO EPSON CORPORATION (JP)

( * ) Notice: Subject to any disclaimer, the term of this patent is extended or adjusted under 35 U.S.C. 154(b) by 238 days.

(21) Appl. No.: 18/306,552

(22) Filed: Apr. 25, 2023

(65) Prior Publication Data

US 2023/0341894 A1    Oct. 26, 2023

(30) Foreign Application Priority Data

Apr. 26, 2022   (JP) .................................. 2022-072184

(51) Int. Cl.
*G11C 7/00*   (2006.01)
*G06F 1/14*   (2006.01)
*G11C 16/10*  (2006.01)
*G11C 16/30*  (2006.01)
*G11C 16/32*  (2006.01)

(52) U.S. Cl.
CPC ................ *G06F 1/14* (2013.01); *G11C 16/10* (2013.01); *G11C 16/30* (2013.01); *G11C 16/32* (2013.01)

(58) Field of Classification Search
CPC ....... G11C 5/147; G11C 5/14; G11C 11/4074; G11C 16/30; G11C 5/143
USPC ......................................................... 365/226
See application file for complete search history.

(56) References Cited

U.S. PATENT DOCUMENTS

2018/0307294 A1\* 10/2018 Kato ..................... G06F 1/3287

FOREIGN PATENT DOCUMENTS

JP           2007-328404 A      12/2007

\* cited by examiner

*Primary Examiner* — Son T Dinh
(74) *Attorney, Agent, or Firm* — Harness, Dickey & Pierce, P.L.C.

(57) ABSTRACT

A real-time clock module coupled to a memory device includes: a timing circuit configured to measure a time to generate time data; a first interface circuit configured to function as a master interface for the memory device; a power supply circuit configured to supply a power supply voltage to the memory device; and a control circuit configured to write, to the memory device, target time data corresponding to at least a part of time digits of the time data via the first interface circuit after the supply of the power supply voltage to the memory device is started, and to stop the supply of the power supply voltage after the target time data is written.

8 Claims, 7 Drawing Sheets

FIG. 3
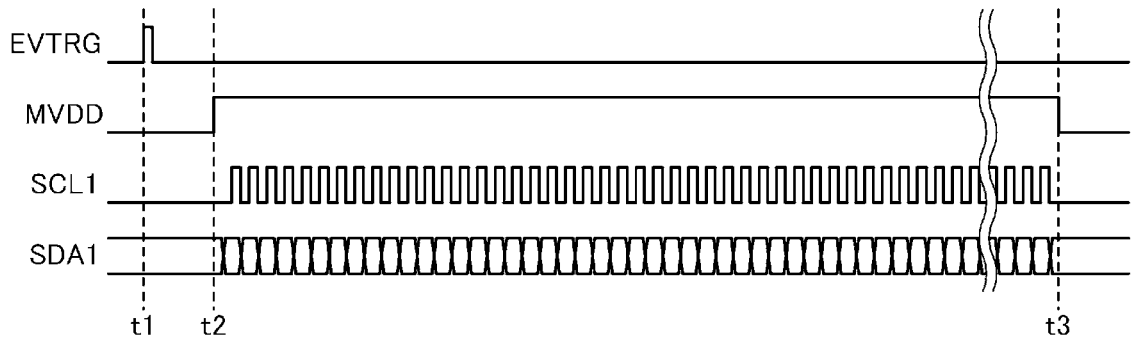
FIG. 4
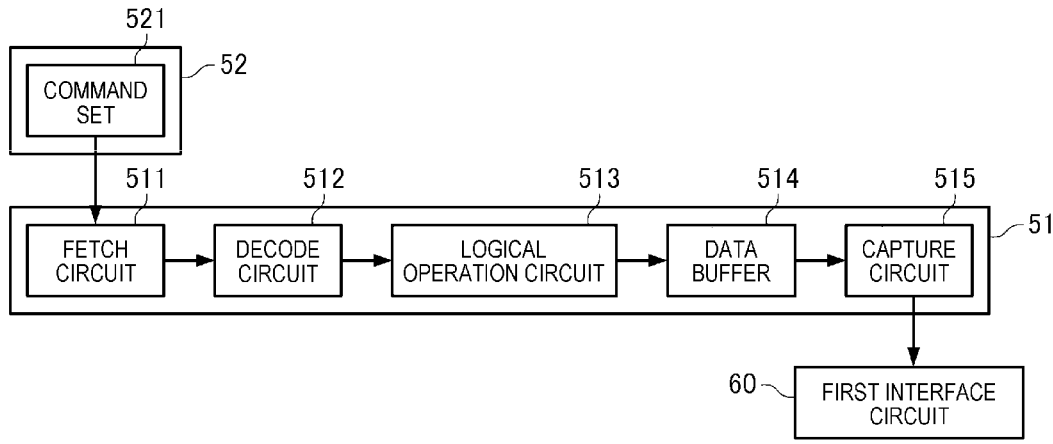
FIG. 5
| address | data | | | | | | | |
|---|---|---|---|---|---|---|---|---|
| | bit7 | bit6 | bit5 | bit4 | bit3 | bit2 | bit1 | bit0 |
| 0x0 | SSB[5] | SSB[4] | SSB[3] | SSB[2] | SSB[1] | SSB[0] | CPEPOL EVIN3 | CPEPOL EVIN2 |
| 0x1 | S8 | S4 | S2 | S1 | SSB[9] | SSB[8] | SSB[7] | SSB[6] |
| 0x2 | M10 | M8 | M4 | M2 | M1 | S40 | S20 | S10 |
| 0x3 | H20 | H10 | H8 | H4 | H2 | H1 | M40 | M20 |
| 0x4 | MO2 | MO1 | D20 | D10 | D8 | D4 | D2 | D1 |
| 0x5 | Y10 | Y8 | Y4 | Y2 | Y1 | MO10 | MO8 | MO4 |
| 0x6 | VBATLOW Stat | VTMPLOW Stat | VDDLOW Stat | FST Stat | CPEPOL EVIN1 | Y80 | Y40 | Y20 |
| 0x7 | CPEvnt EVIN3 | CPEvnt EVIN2 | CPEvnt EVIN1 | CPEvnt VBATLOW | CPEvnt VTMPLOW | CPEvnt VDDLOW | CPEvnt FST | CPEvnt WRCom |

| address | data | | | | | | | |
|---|---|---|---|---|---|---|---|---|
| | bit7 | bit6 | bit5 | bit4 | bit3 | bit2 | bit1 | bit0 |
| 0x0 | 0 | S40 | S20 | S10 | S8 | S4 | S2 | S1 |
| 0x1 | 0 | M40 | M20 | M10 | M8 | M4 | M2 | M1 |
| 0x2 | 0 | 0 | H20 | H10 | H8 | H4 | H2 | H1 |
| 0x3 | 0 | 0 | D20 | D10 | D8 | D4 | D2 | D1 |
| 0x4 | CPEPOL EVIN3 | CPEPOL EVIN2 | CPEPOL EVIN1 | MO10 | MO8 | MO4 | MO2 | MO1 |
| 0x5 | Y80 | Y40 | Y20 | Y10 | Y8 | Y4 | Y2 | Y1 |
| 0x6 | SEN[15] | SEN[14] | SEN[13] | SEN[12] | SEN[11] | SEN[10] | SEN[9] | SEN[8] |
| 0x7 | SEN[7] | SEN[6] | SEN[5] | SEN[4] | SEN[3] | SEN[2] | SEN[1] | SEN[0] |

REAL-TIME CLOCK MODULE AND ELECTRONIC DEVICE

The present application is based on, and claims priority from JP Application Serial Number 2022-072184, filed Apr. 26, 2022, the disclosure of which is hereby incorporated by reference herein in its entirety.

BACKGROUND

1. Technical Field

The present disclosure relates to a real-time clock module and an electronic device.

2. Related Art

JP-A-2007-328404 discloses a real-time clock device that operates at a low voltage and a low current by transferring real-time data stored in a nonvolatile memory to a volatile memory when an initial power supply is turned on, stopping current supply to the nonvolatile memory when the transfer of the real-time data is completed, and performing time measurement by a real-time clock circuit using the real-time data stored in the volatile memory and a source oscillation received from an oscillation circuit.

However, although the real-time clock device described in JP-A-2007-328404 reduces power consumption of the nonvolatile memory by controlling the current supply to the built-in nonvolatile memory immediately after the initial power supply is turned on, power consumption of a memory device for writing time data cannot be reduced when the memory device is externally attached.

SUMMARY

A real-time clock module according to one aspect of the present disclosure is a real-time clock module coupled to a memory device, and the real-time clock module includes:
- a timing circuit configured to measure a time to generate time data;
- a first interface circuit configured to function as a master interface for the memory device;
- a power supply circuit configured to supply a power supply voltage to the memory device; and
- a control circuit configured to write, to the memory device, target time data corresponding to at least a part of time digits of the time data via the first interface circuit after the supply of the power supply voltage to the memory device is started, and to stop the supply of the power supply voltage to the memory device after the target time data is written to the memory device.

An electronic device according to one aspect of the present disclosure includes:
- the real-time clock module according to the above aspect; and
- the memory device.

BRIEF DESCRIPTION OF THE DRAWINGS

FIG. 3 is a timing chart showing an example of time stamp processing based on an event trigger signal, which is performed by a control circuit.

FIG. 4 is a diagram showing a configuration example of a processor.

FIG. 5 is a diagram showing an example of capture data in the first embodiment.

DESCRIPTION OF EXEMPLARY EMBODIMENTS

Hereinafter, preferred embodiments of the present disclosure will be described in detail with reference to the drawings. The embodiments to be described below do not unduly limit contents of the present disclosure described in the claims. Not all configurations to be described below are necessarily essential components of the present disclosure.

1. Real-time Clock Module

1-1. First Embodiment

Figure 1:
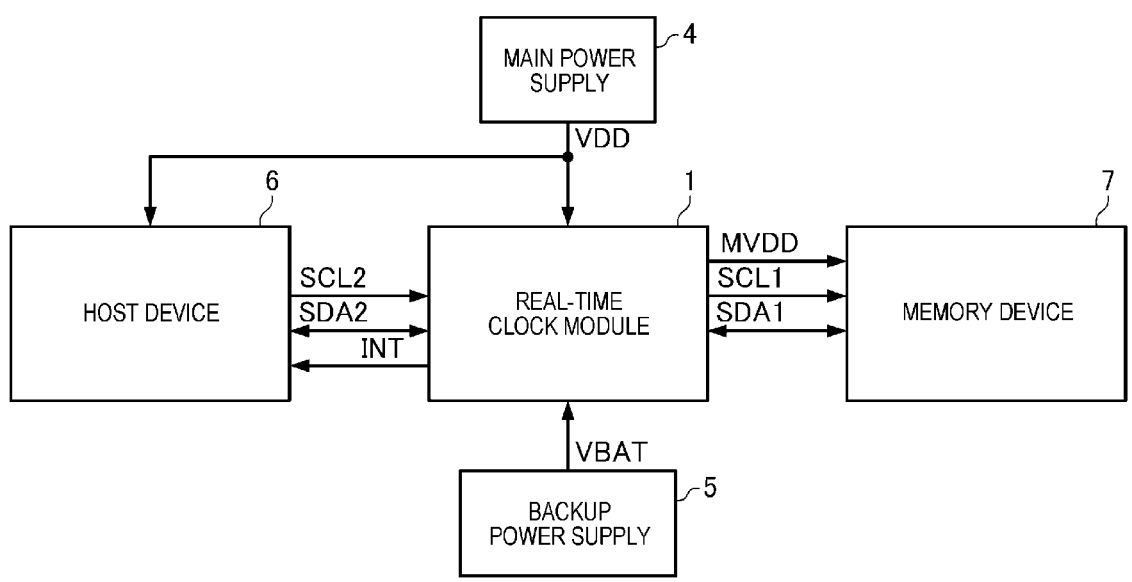
FIG. 1 is a diagram showing a configuration example of a system including a real-time clock module according to a first embodiment.

FIG. 1 is a diagram showing a configuration example of a system including a real-time clock module according to a first embodiment.

As shown in FIG. 1, a real-time clock module 1 according to the first embodiment is coupled to a main power supply 4, a backup power supply 5, a host device 6, and a memory device 7.

The real-time clock module 1 is supplied with a power supply voltage VDD from the main power supply 4 and supplied with a power supply voltage VBAT from the backup power supply 5. The real-time clock module 1 operates at the power supply voltage VDD when the power supply voltage VDD is supplied from the main power supply 4, and operates at the power supply voltage VBAT when the supply of the power supply voltage VDD from the main power supply 4 is cut off. Therefore, the real-time clock module 1 can continue a timing operation even while the supply of the power supply voltage VDD from the main power supply 4 is cut off.

The host device 6 operates by being supplied with the power supply voltage VDD from the main power supply 4. In the embodiment, the host device 6 and the real-time clock module 1 communicate with each other via an I$^2$C bus with the host device 6 as a master and the real-time clock module 1 as a slave. I$^2$C is an abbreviation for an inter-integrated circuit. The host device 6 is implemented by, for example, an MCU or an MPU. The MCU is an abbreviation for a micro controller unit, and the MPU is an abbreviation for a micro processor unit.

The memory device 7 operates by being supplied with a power supply voltage MVDD from the real-time clock module 1. The memory device 7 is, for example, a nonvolatile memory such as an EEPROM. The EEPROM is an abbreviation for an electrically erasable programmable read-only memory.

In the embodiment, the real-time clock module 1 and the memory device 7 communicate with each other via the I²C bus with the real-time clock module 1 as a master and the memory device 7 as a slave.

Figure 2:
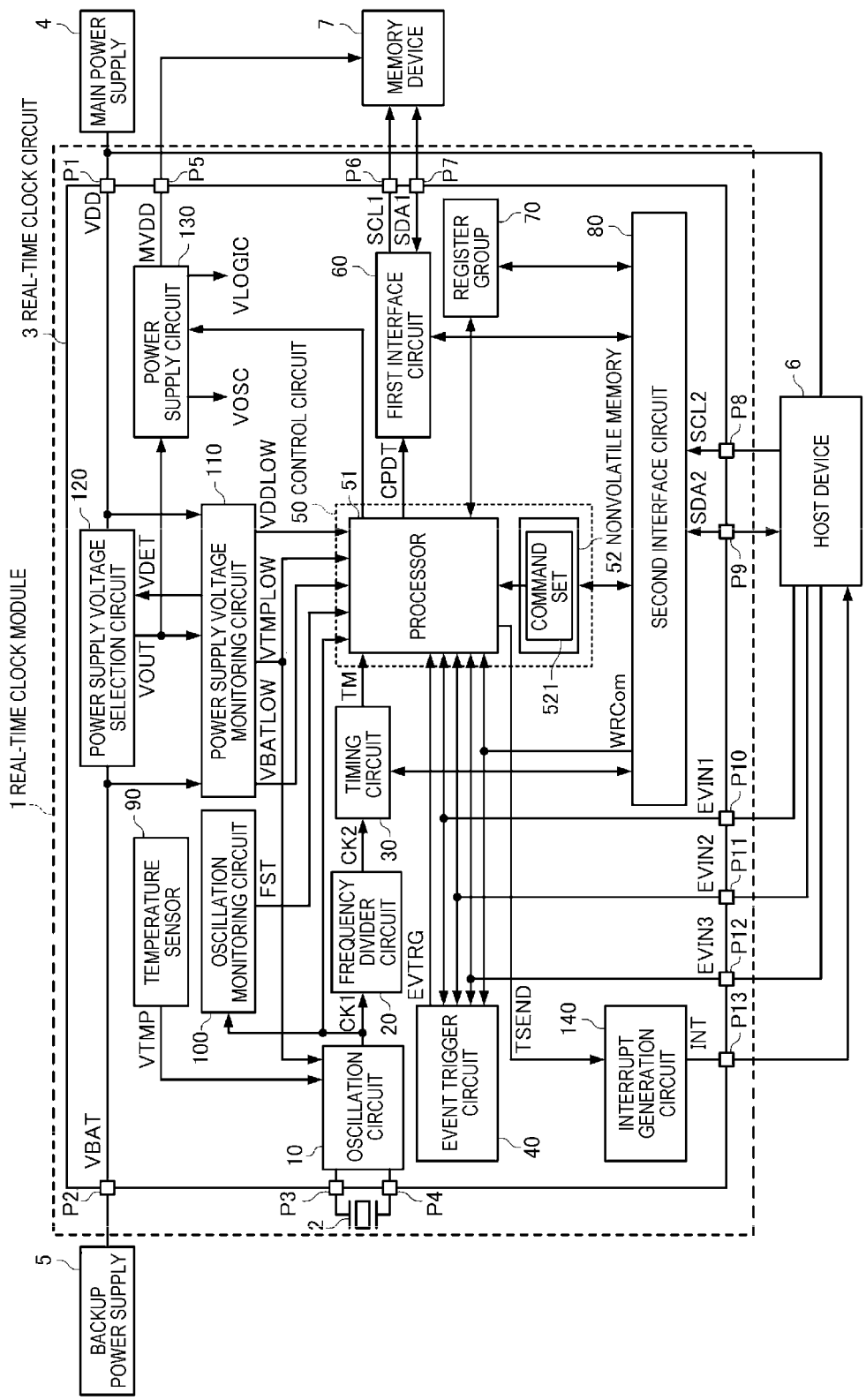
FIG. 2 is a functional block diagram of the real-time clock module according to the first embodiment.

FIG. 2 is a functional block diagram of the real-time clock module 1 according to the first embodiment. As shown in FIG. 2, the real-time clock module 1 includes a resonator 2 and a real-time clock circuit 3.

The real-time clock module 1 is supplied with the power supply voltage VDD from the main power supply 4 via a terminal P1 of the real-time clock circuit 3, and is supplied with the power supply voltage VBAT from the backup power supply 5 via a terminal P2 of the real-time clock circuit 3.

The resonator 2 may be a tuning fork type quartz crystal resonator, an AT cut quartz crystal resonator, an SC cut quartz crystal resonator, and the like, or may be a piezoelectric resonator other than a SAW resonator or a quartz crystal resonator. The SAW is an abbreviation for a surface acoustic wave. The resonator 2 may be a MEMS resonator made of a silicon semiconductor. MEMS is an abbreviation for micro electro mechanical systems. The resonator 2 may be excited by a piezoelectric effect or may be driven by a Coulomb force.

The real-time clock circuit 3 includes an oscillation circuit 10, a frequency divider circuit 20, a timing circuit 30, an event trigger circuit 40, a control circuit 50, a first interface circuit 60, a register group 70, a second interface circuit 80, a temperature sensor 90, an oscillation monitoring circuit 100, a power supply voltage monitoring circuit 110, a power supply voltage selection circuit 120, a power supply circuit 130, and an interrupt generation circuit 140. However, the real-time clock circuit 3 may have a configuration in which a part of the elements are omitted or changed, or other elements are added. In the embodiment, the real-time clock circuit 3 is a one-chip integrated circuit. The real-time clock circuit 3 may be a multiple-chip integrated circuit, or at least a part thereof may be implemented by discrete components.

The power supply voltage monitoring circuit 110 monitors the power supply voltage VDD, determines whether the power supply voltage VDD is equal to or higher than a predetermined voltage value VT1, and outputs a determination signal VDET. In the embodiment, the power supply voltage monitoring circuit 110 outputs the determination signal VDET at a high level when it is determined that the power supply voltage VDD is equal to or higher than the voltage value VT1, and outputs the determination signal VDET at a low level when it is determined that the power supply voltage VDD is lower than the voltage value VT1.

The power supply voltage monitoring circuit 110 monitors the power supply voltage VDD, determines whether the power supply voltage VDD is equal to or lower than a predetermined voltage value VT2, and outputs a first power supply voltage drop signal VDDLOW. In the embodiment, the power supply voltage monitoring circuit 110 outputs the first power supply voltage drop signal VDDLOW at a high level when it is determined that the power supply voltage VDD is equal to or lower than the voltage value VT2, and outputs the first power supply voltage drop signal VDDLOW at a low level when it is determined that the power supply voltage VDD is higher than the voltage value VT2. The voltage value VT2 may be the same as or different from the voltage value VT1.

The power supply voltage monitoring circuit 110 monitors the power supply voltage VBAT, determines whether the power supply voltage VBAT is equal to or lower than a predetermined voltage value VT3, and outputs a second power supply voltage drop signal VBATLOW. In the embodiment, the power supply voltage monitoring circuit 110 outputs the second power supply voltage drop signal VBATLOW at a high level when it is determined that the power supply voltage VBAT is equal to or lower than the voltage value VT3, and outputs the second power supply voltage drop signal VBATLOW at a low level when it is determined that the power supply voltage VBAT is higher than the voltage value VT3.

The power supply voltage monitoring circuit 110 monitors a power supply voltage VOUT output from the power supply voltage selection circuit 120, determines whether the power supply voltage VOUT is equal to or lower than a predetermined voltage value VT4, and outputs a third power supply voltage drop signal VTMPLOW. In the embodiment, the power supply voltage monitoring circuit 110 outputs the third power supply voltage drop signal VTMPLOW at a high level when it is determined that the power supply voltage VOUT is equal to or lower than the voltage value VT4, and outputs the third power supply voltage drop signal VTMPLOW at a low level when it is determined that the power supply voltage VOUT is higher than the voltage value VT4.

As described above, the power supply voltage monitoring circuit 110 monitors the power supply voltages VDD, VBAT, and VOUT, and generates the first power supply voltage drop signal VDDLOW, the second power supply voltage drop signal VBATLOW, and the third power supply voltage drop signal VTMPLOW which are power supply voltage monitoring data.

The power supply voltage selection circuit 120 selects the power supply voltage VDD or the power supply voltage VBAT based on the determination signal VDET, and outputs the selected power supply voltage as the power supply voltage VOUT. Specifically, when the determination signal VDET is at a high level, that is, when the power supply voltage monitoring circuit 110 determines that the power supply voltage VDD is equal to or higher than the voltage value VT1, the power supply voltage selection circuit 120 selects the power supply voltage VDD. When the determination signal VDET is at a low level, that is, when the power supply voltage monitoring circuit 110 determines that the power supply voltage VDD is lower than the voltage value VT1, the power supply voltage selection circuit 120 selects the power supply voltage VBAT.

Therefore, when the power supply voltage VDD is supplied from the main power supply 4 to the real-time clock module 1, the power supply voltage VOUT is the power supply voltage VDD and has a predetermined voltage value equal to or higher than the voltage value VT1. When a supply of the power supply voltage VDD from the main power supply 4 to the real-time clock module 1 is cut off, the power supply voltage VOUT is immediately switched to the power supply voltage VBAT and becomes a predetermined voltage value equal to or lower than the voltage value VT1. Therefore, the real-time clock module 1 can continue the timing operation even while the supply of the power supply voltage VDD from the main power supply 4 is cut off. On the other hand, the host device 6 that controls an operation of the real-time clock module 1 operates by being supplied with the power supply voltage VDD from the main power supply 4, and stops the operation when the supply of the power supply voltage VDD from the main power supply 4 is cut off.

The power supply circuit 130 generates, based on the power supply voltage VOUT, a power supply voltage VOSC and a power supply voltage VLOGIC stabilized at a constant voltage value. The power supply circuit 130 is implemented by, for example, a regulator.

The power supply voltage VOSC is supplied to the oscillation circuit 10. The power supply voltage VLOGIC is supplied to the frequency divider circuit 20, the timing circuit 30, the event trigger circuit 40, the control circuit 50, the first interface circuit 60, the register group 70, the second interface circuit 80, the temperature sensor 90, the oscillation monitoring circuit 100, the power supply voltage monitoring circuit 110, and the interrupt generation circuit 140.

Further, the power supply circuit 130 generates the power supply voltage MVDD in response to an instruction from the control circuit 50, and supplies the power supply voltage MVDD to the memory device 7 via a terminal P5 of the real-time clock circuit 3.

The temperature sensor 90 outputs a temperature signal VTMP whose magnitude changes according to a temperature. The temperature signal VTMP may be a digital signal or an analog signal.

The oscillation circuit 10 oscillates the resonator 2 to generate a first clock signal CK1. Specifically, the oscillation circuit 10 is electrically coupled to both ends of the resonator 2 via terminals P3 and P4 of the real-time clock circuit 3, and amplifies and feeds back an output signal of the resonator 2 to oscillate the resonator 2 to output the first clock signal CK1. The oscillation circuit 10 incorporates a temperature compensation circuit that controls a frequency of the first clock signal CK1 to be constant regardless of the temperature by changing the frequency of the first clock signal CK1 according to the temperature signal VTMP output from the temperature sensor 90. In the embodiment, the frequency of the first clock signal CK1 is 32.768 kHz. However, the frequency of the first clock signal CK1 is not particularly limited. In the embodiment, when the power supply voltage VOUT is higher than the voltage value VT4, that is, when the third power supply voltage drop signal VTMPLOW is at a low level, the temperature compensation circuit operates normally. On the other hand, when the power supply voltage VOUT is equal to or lower than the voltage value VT4, that is, when the third power supply voltage drop signal VTMPLOW is at a high level, a normal operation of the temperature compensation circuit is not guaranteed, and thus the temperature compensation circuit stops the operation.

The oscillation monitoring circuit 100 monitors the first clock signal CK1, determines whether an oscillation operation of the oscillation circuit 10 is stopped, and outputs an oscillation stop signal FST. In the embodiment, the oscillation monitoring circuit 100 determines that the oscillation operation of the oscillation circuit 10 is stopped when a logic level of the first clock signal CK1 continues for a predetermined time and is not inverted within the predetermined time, and outputs the oscillation stop signal FST at a high level. When the logic level of the first clock signal CK1 is inverted within the predetermined time, the oscillation monitoring circuit 100 determines that the oscillation operation of the oscillation circuit 10 does not stop, and outputs the oscillation stop signal FST at a low level. As described above, the oscillation monitoring circuit 100 monitors the first clock signal CK1 and generates the oscillation stop signal FST which is oscillation monitoring data.

The frequency divider circuit 20 divides the frequency of the first clock signal CK1 to generate a second clock signal CK2 having a desired frequency. In the embodiment, a frequency division ratio of the frequency divider circuit 20 is 32, and a frequency of the second clock signal CK2 is 1.024 kHz. However, the frequency division ratio of the frequency divider circuit 20 and the frequency of the second clock signal CK2 are not particularly limited.

The timing circuit 30 measures a time based on the second clock signal CK2 to generate time data TM. In the embodiment, the time data TM has $1/1024$ seconds, seconds, minutes, hours, days, months, and years as time digits. Specifically, the time data TM includes subsecond data in a binary format in which the time in units of $1/1024$ seconds is represented by 0 to 1023, second data in a BCD format in which the time in units of seconds is represented by 0 to 59, minute data in a BCD format in which the time in units of minutes is represented by 0 to 59, hour data in a BCD format in which the time in units of hours is represented by 0 to 23, day data in a BCD format in which the time in units of days is represented by 1 to 31, month data in a BCD format in which the time in units of months is represented by 1 to 12, and year data in a BCD format in which the time in units of years is represented by 0 to 9999. BCD is an abbreviation for binary coded decimal.

The event trigger circuit 40 receives a first event signal EVIN1, a second event signal EVIN2, and a third event signal EVIN3 received from the host device 6 via terminals P10, P11, and P12 of the real-time clock circuit 3. An event command detection signal WRCom output from the second interface circuit 80 is input to the event trigger circuit 40. The first power supply voltage drop signal VDDLOW, the second power supply voltage drop signal VBATLOW, and the third power supply voltage drop signal VTMPLOW output from the power supply voltage monitoring circuit 110 are input to the event trigger circuit 40. The oscillation stop signal FST output from the oscillation monitoring circuit 100 is input to the event trigger circuit 40. When a rising edge of at least one of the event command detection signal WRCom, the first power supply voltage drop signal VDDLOW, the second power supply voltage drop signal VBATLOW, the third power supply voltage drop signal VTMPLOW, and the oscillation stop signal FST occurs, the event trigger circuit 40 outputs a high-pulse event trigger signal EVTRG. When at least one of an edge specified by the first event signal EVIN1, an edge specified by the second event signal EVIN2, and an edge specified by the third event signal EVIN3 occurs, the event trigger circuit 40 outputs the high-pulse event trigger signal EVTRG. Each edge of the first event signal EVIN1, the second event signal EVIN2, and the third event signal EVIN3 that generates the event trigger signal EVTRG may be able to specify a rising edge, a falling edge, or both the rising edge and the falling edge by an event control register included in the register group 70.

The control circuit 50 controls the supply of the power supply voltage MVDD from the power supply circuit 130 to the memory device 7, and controls the writing of the time data TM to the memory device 7 via the first interface circuit 60. Specifically, after controlling the power supply circuit 130 to start the supply of the power supply voltage MVDD to the memory device 7, the control circuit 50 writes target time data corresponding to at least a part of the time digits of the time data TM to the memory device 7 via the first interface circuit 60, and controls the power supply circuit 130 to stop the supply of the power supply voltage MVDD to the memory device 7 after the target time data is written to the memory device 7.

In particular, in the embodiment, the control circuit 50 starts the supply of the power supply voltage MVDD to the memory device 7 in response to generation of an event. In response to the generation of the event, the control circuit 50 selects at least one of a plurality of types of event data as target event data to be stored, and selects, as target time data to be stored, data corresponding to at least a part of time digits of the time data TM generated by the timing circuit 30. That is, in response to the event trigger signal EVTRG output from the event trigger circuit 40, the control circuit 50 starts the supply of the power supply voltage MVDD to the memory device 7, and selects target event data and target time data.

The plurality of types of event data may include the first power supply voltage drop signal VDDLOW, the second power supply voltage drop signal VBATLOW, and the third power supply voltage drop signal VTMPLOW, which are the power supply voltage monitoring data generated by the power supply voltage monitoring circuit 110. The plurality of types of event data may include the oscillation stop signal FST which is the oscillation monitoring data generated by the oscillation monitoring circuit 100.

The event may be generated by an external input signal received from the outside of the real-time clock module 1, and the plurality of types of event data may include data corresponding to the external input signal. In the embodiment, the external input signals are the first event signal EVIN1, the second event signal EVIN2, the third event signal EVIN3, and an event generation command for generating an event, and the data corresponding to the external input signals are the first event signal EVIN1, the second event signal EVIN2, the third event signal EVIN3, and the event command detection signal WRCom.

The control circuit 50 causes the memory device 7 to store capture data CPDT including the target time data and the target event data via the first interface circuit 60. That is, the control circuit 50 performs time stamp processing of causing the memory device 7 to store the target time data and the target event data in association with each other in response to the event trigger signal EVTRG.

Further, after the time stamp processing is completed, the control circuit 50 stops the supply of the power supply voltage MVDD to the memory device 7.

FIG. 3 is a timing chart showing an example of the time stamp processing based on the event trigger signal EVTRG, which is performed by the control circuit 50. In the example of FIG. 3, the event trigger signal EVTRG changes from the low level to the high level at a time t1, and the control circuit 50 starts the supply of the power supply voltage MVDD from the power supply circuit 130 to the memory device 7 at a time t2. Next, in a period of time t2 to t3, the control circuit 50 continues the supply of the power supply voltage MVDD from the power supply circuit 130 to the memory device 7, and writes the capture data CPDT to the memory device 7 via the first interface circuit 60. Then, at the time t3 after the end of the writing of the capture data CPDT to the memory device 7, the control circuit 50 stops the supply of the power supply voltage MVDD from the power supply circuit 130 to the memory device 7.

In the embodiment, the control circuit 50 includes a processor 51 and a nonvolatile memory 52. The nonvolatile memory 52 stores a command set 521 that specifies the target time data and the target event data. The processor 51 starts the supply of the power supply voltage MVDD from the power supply circuit 130 to the memory device 7 based on the command set 521 in synchronization with the first clock signal CK1, selects the target time data and the target event data, causes the memory device 7 to store the target time data and the target event data via the first interface circuit 60, and then stops the supply of the power supply voltage MVDD from the power supply circuit 130 to the memory device 7. That is, the command set 521 includes a plurality of command codes necessary for the control circuit 50 to perform the time stamp processing.

In order to reduce the power consumption, the processor 51 may return from the sleep state by the generation of the event trigger signal EVTRG, perform the control processing of the power supply circuit 130 and the time stamp processing, and shift to the sleep state again when the processing is completed.

FIG. 4 is a diagram showing a configuration example of the processor 51. As shown in FIG. 4, the processor 51 includes a fetch circuit 511, a decode circuit 512, a logical operation circuit 513, a data buffer 514, and a capture circuit 515.

The fetch circuit 511 sequentially fetches command codes included in the command set 521 in synchronization with the first clock signal CK1.

The decode circuit 512 sequentially decodes the command codes fetched by the fetch circuit 511 in synchronization with the first clock signal CK1, and outputs a control signal corresponding to the decode result.

The logical operation circuit 513 performs, on one or two types of input data selected from a plurality of types of input data according to the control signal output from the decode circuit 512, a logical operation selected from a plurality of types of logical operations according to the control signal. The plurality of types of input data include the subsecond data, the second data, the minute data, the hour data, the day data, the month data, and the year data included in the time data TM, the first power supply voltage drop signal VDDLOW, the second power supply voltage drop signal VBATLOW, the third power supply voltage drop signal VTMPLOW, the oscillation stop signal FST, the first event signal EVIN1, the second event signal EVIN2, the third event signal EVIN3, the event command detection signal WRCom, and the like included in the plurality of types of event data. The plurality of types of logical operations include, for example, a through operation, a NOT operation, an AND operation, an OR operation, an XOR operation, a bit shift operation, an addition, and a subtraction.

The data buffer 514 holds data output from the logical operation circuit 513 in synchronization with the first clock signal CK1.

The capture circuit 515 writes the data held by the data buffer 514 to a predetermined address of the memory device 7 via the first interface circuit 60 in synchronization with the first clock signal CK1 according to the control signal output from the decode circuit 512, and increments the address. The data buffer 514 sequentially holds, for example, 8-bit data constituting the capture data CPDT, and the capture circuit 515 writes the data to the memory device 7 via the first interface circuit 60.

In the embodiment, when the event trigger signal EVTRG is generated, according to the command set 521, the processor 51 can cause the memory device 7 to store the capture data CPDT including the selected target time data and target event data. That is, any type of data constituting the capture data CPDT can be selected by the command set 521.

When the event trigger signal EVTRG is generated, according to the command set 521, the processor 51 can perform the time stamp processing only when a generation factor of the event trigger signal EVTRG is any one or more types of signals selected from the first power supply voltage drop signal VDDLOW, the second power supply voltage drop signal VBATLOW, the third power supply voltage drop signal VTMPLOW, the oscillation stop signal FST, the first event signal EVIN1, the second event signal EVIN2, the third event signal EVIN3, and the event command detection signal WRCom. That is, a signal which is a trigger factor of the time stamp processing can be freely selected by the command set 521. For example, when only the first event signal EVIN1 is selected by the command set 521 as a signal which is the trigger factor of the time stamp processing, the processor 51 can determine whether the generation factor of the event trigger signal EVTRG is the first event signal EVIN1 based on a logic level of the first event signal EVIN1 when the event trigger signal EVTRG is generated, and can determine whether to perform the time stamp processing based on the determination result.

Returning to the description of FIG. 2, the first interface circuit 60 is an interface circuit for communication between the real-time clock module 1 and the memory device 7. In the communication by the first interface circuit 60, the real-time clock module 1 is a master and the memory device 7 is a slave. That is, the first interface circuit 60 functions as a master interface for the memory device 7. In the embodiment, the first interface circuit 60 is an interface circuit compatible with the I²C bus, and communicates with the memory device 7 based on a serial clock signal SCL1 output via a terminal P6 of the real-time clock circuit 3 and a serial data signal SDA1 input and output via a terminal P7 of the real-time clock circuit 3. However, the first interface circuit 60 may be an interface circuit compatible with other serial buses such as SPI, or may be an interface circuit compatible with a parallel bus. SPI is an abbreviation for a serial peripheral interface.

The first interface circuit 60 transmits a command, according to an instruction from the processor 51, to the memory device 7 via the terminals P6 and P7. The memory device 7 receives the command and performs various types of processing according to the command. For example, the first interface circuit 60 performs processing of sequentially acquiring, for example, 8-bit data constituting the capture data CPDT output from the control circuit 50 and writing the data in the memory device 7.

When a control signal requesting reading of the capture data CPDT is received from the second interface circuit 80, the first interface circuit 60 reads the capture data CPDT from the memory device 7 and outputs the capture data CPDT to the second interface circuit 80.

The memory device 7 stores the capture data CPDT including the target time data and the target event data selected by the control circuit 50. In the embodiment, the memory device 7 is a nonvolatile memory such as an EEPROM, and functions as N-stage FIFO capable of storing N pieces of capture data CPDT. That is, the memory device 7 can simultaneously store the N pieces of capture data CPDT for the generation of N events. FIFO is an abbreviation for first in first out.

FIG. 5 is a diagram showing an example of the capture data CPDT stored in the memory device 7. In the example of FIG. 5, the capture data CPDT is 64-bit data, and is stored in, for example, addresses 0x0 to 0x7 of the memory device 7.

Specifically, at the address 0x0 of the memory device 7, the lower 6-bit data of the 10-bit subsecond data included in the time data TM is stored in the bits 7 to 2, data corresponding to a logic level of the third event signal EVIN3 is stored in the bit 1, and data corresponding to a logic level of the second event signal EVIN2 is stored in the bit 0.

At the address 0x1 of the memory device 7, the lower 4-bit data of the 7-bit second data included in the time data TM is stored in the bits 7 to 4, and the upper 4-bit data of the 10-bit subsecond data is stored in the bits 3 to 0.

At the address 0x2 of the memory device 7, the 5-bit minute data included in the time data TM is stored in the bits 7 to 3, and the upper 3-bit data of the 7-bit second data is stored in the bits 2 to 0.

At the address 0x3 of the memory device 7, the 6-bit hour data included in the time data TM is stored in the bits 7 to 2, and the upper 2-bit data of the 7-bit minute data is stored in the bits 1 to 0.

At the address 0x4 of the memory device 7, the lower 2-bit data of the 5-bit month data included in the time data TM is stored in the bits 7 to 6, and the 6-bit day data included in the time data TM is stored in the bits 5 to 0.

At the address 0x5 of the memory device 7, the lower 5-bit data of the 8-bit year data included in the time data TM is stored in the bits 7 to 3, and the upper 3-bit data of the 5-bit month data is stored in the bits 2 to 0.

At the address 0x6 of the memory device 7, data corresponding to a logic level of the second power supply voltage drop signal VBATLOW is stored in the bit 7, data corresponding to a logic level of the third power supply voltage drop signal VTMPLOW is stored in the bit 6, data corresponding to a logic level of the first power supply voltage drop signal VDDLOW is stored in the bit 5, data corresponding to a logic level of the oscillation stop signal FST is stored in the bit 4, data corresponding to the logic level of the first event signal EVIN1 is stored in the bit 3, and the upper 3-bit data of the 8-bit year data is stored in the bits 2 to 0.

At the address 0x7 of the memory device 7, data indicating a trigger factor of the time stamp processing is stored. Specifically, 1 is stored in the bit 7 when the third event signal EVIN3 is the trigger factor, 1 is stored in the bit 6 when the second event signal EVIN2 is the trigger factor, 1 is stored in the bit 5 when the first event signal EVIN1 is the trigger factor, 1 is stored in the bit 4 when the second power supply voltage drop signal VBATLOW is the trigger factor, 1 is stored in the bit 3 when the third power supply voltage drop signal VTMPLOW is the trigger factor, 1 is stored in the bit 2 when the first power supply voltage drop signal VDDLOW is the trigger factor, 1 is stored in the bit 1 when the oscillation stop signal FST is the trigger factor, and 1 is stored in the bit 0 when the event command detection signal WRCom is the trigger factor.

In the example of FIG. 5, the subsecond data, the second data, the minute data, the hour data, the day data, the month data, and the year data is the target time data, and all the other data is the target event data.

Returning to the description of FIG. 2, when the time stamp processing based on the event trigger signal EVTRG ends, the processor 51 outputs a time stamp end signal TSEND to the interrupt generation circuit 140.

The interrupt generation circuit 140 generates an interrupt signal INT based on the time stamp end signal TSEND, and outputs the interrupt signal INT to the host device 6 via a terminal P13 of the real-time clock circuit 3. When receiving the interrupt signal INT, the host device 6 performs predetermined interrupt processing. For example, the host device 6 transmits a command for requesting data reading of a time stamp to the real-time clock module 1, and receives the capture data CPDT stored in the memory device 7 from the real-time clock module 1.

In order to reduce the power consumption of the entire system, the host device 6 shifts to the sleep state when the processing is not performed, returns from the sleep state to perform processing of reading the data of the time stamp when receiving the interrupt signal INT in the sleep state, and shifts to the sleep state again when necessary processing ends.

The register group 70 includes various registers. For example, the register group 70 includes an event control register, a flag register, a command trigger register, and the like. The event control register holds, for example, 2-bit data for specifying one of a rising edge, a falling edge, and both the rising edge and the falling edge as each of the edges of the first event signal EVIN1, the second event signal EVIN2, and the third event signal EVIN3 that generate the event trigger signal EVTRG. The flag register holds a first power supply voltage drop flag in which 1 is set by the generation of the rising edge of the first power supply voltage drop signal VDDLOW, a second power supply voltage drop flag in which 1 is set by the generation of the rising edge of the second power supply voltage drop signal VBATLOW, a third power supply voltage drop flag in which 1 is set by the generation of the rising edge of the third power supply voltage drop signal VTMPLOW, an oscillation stop flag in which 1 is set by the generation of the rising edge of the oscillation stop signal FST, and the like. The command trigger register is a register for generating the event command detection signal WRCom in response to the event generation command.

The second interface circuit 80 is an interface circuit for communication between the real-time clock module 1 and the host device 6. In the communication by the second interface circuit 80, the host device 6 is a master and the real-time clock module 1 is a slave. That is, the second interface circuit 80 functions as a slave interface for the host device 6. In the embodiment, the second interface circuit 80 is an interface circuit compatible with the I²C bus, and communicates with the host device 6 based on a serial clock signal SCL2 input via a terminal P8 of the real-time clock circuit 3 and a serial data signal SDA2 input and output via a terminal P9 of the real-time clock circuit 3. However, the second interface circuit 80 may be an interface circuit compatible with other serial buses such as SPI, or may be an interface circuit compatible with a parallel bus. SPI is an abbreviation for a serial peripheral interface.

The second interface circuit 80 receives a command from the host device 6 via the terminals P8 and P9, and performs various types of processing according to the received command.

Specifically, when the second interface circuit 80 receives a command for requesting time setting from the host device 6, the second interface circuit 80 updates the time data TM generated by the timing circuit 30 to the time data included in the command.

When the second interface circuit 80 receives a command for requesting time reading from the host device 6, the second interface circuit 80 acquires the time data TM generated by the timing circuit 30 and transmits the time data TM to the host device 6.

When the second interface circuit 80 receives a command for requesting data reading of the time stamp from the host device 6, the second interface circuit 80 outputs a control signal for requesting reading of the capture data CPDT from the first interface circuit 60, receives the capture data CPDT read from the memory device 7 by the first interface circuit 60, and transmits the capture data CPDT to the host device 6. The real-time clock circuit 3 may have a through mode in which the terminal P6 and the terminal P8 are electrically coupled to each other and the terminal P7 and the terminal P9 are electrically coupled to each other. The host device 6 may set the real-time clock circuit 3 to the through mode, then transmit a command for requesting reading of the capture data CPDT to the memory device 7, and receive the capture data CPDT read from the memory device 7.

When the second interface circuit 80 receives, from the host device 6, a command for requesting writing or reading of data to or from various registers included in the register group 70, the second interface circuit 80 performs writing or reading of data to or from a target register. For example, the second interface circuit 80 generates the event command detection signal WRCom when receiving an event generation command which is a command for requesting writing of any data to the command trigger register.

When the second interface circuit 80 receives, from the host device 6, a command for requesting writing or reading of data to or from the nonvolatile memory 52, the second interface circuit 80 performs writing or reading of data to or from the nonvolatile memory 52. For example, in inspection processing before shipment of the real-time clock module 1, an inspection device functioning as the host device 6 transmits a command for requesting writing of the command set 521 to the nonvolatile memory 52, and the second interface circuit 80 receives the command and writes the command set 521 to the nonvolatile memory 52.

As described above, in the real-time clock module 1 according to the first embodiment, the control circuit 50 writes the capture data CPDT to the memory device 7 via the first interface circuit 60 after starting the supply of the power supply voltage MVDD to the memory device 7, and stops the supply of the power supply voltage MVDD to the memory device 7 after writing the capture data CPDT to the memory device 7. That is, according to the real-time clock module 1 of the first embodiment, the supply of the power supply voltage MVDD to the memory device 7 is started before the capture data CPDT is written to the memory device 7, and the supply of the power supply voltage MVDD to the memory device 7 is stopped after the capture data CPDT is written to the memory device 7. Therefore, the power consumption of the memory device 7 can be reduced. Further, since the real-time clock module 1 writes the capture data CPDT to the memory device 7, a period of time during which the host device 6, which consumes more power than the real-time clock module 1, sleeps can be lengthened. Therefore, the power consumption of the entire system can be reduced.

In the real-time clock module 1 according to the first embodiment, in response to the generation of the event, the control circuit 50 selects at least one of the plurality of types of event data as the target event data to be stored, selects data corresponding to at least a part of time digits of the time data TM as the target time data to be stored, and causes the memory device 7 to store the capture data CPDT including the target time data and the target event data. Specifically, in the control circuit 50, the processor 51 selects the target time data and the target event data based on the command set 521 stored in the nonvolatile memory 52. Therefore, according to the real-time clock module 1 of the first embodiment, unnecessary event data for each application in the time stamp can be prevented from being stored in the memory device 7.

1-2. Second Embodiment

In the real-time clock module 1 according to a second embodiment, the same components as those in the first embodiment are denoted by the same reference numerals, the description overlapping with the first embodiment is omitted or simplified, and contents different from those in the first embodiment will be mainly described.

Figure 6:
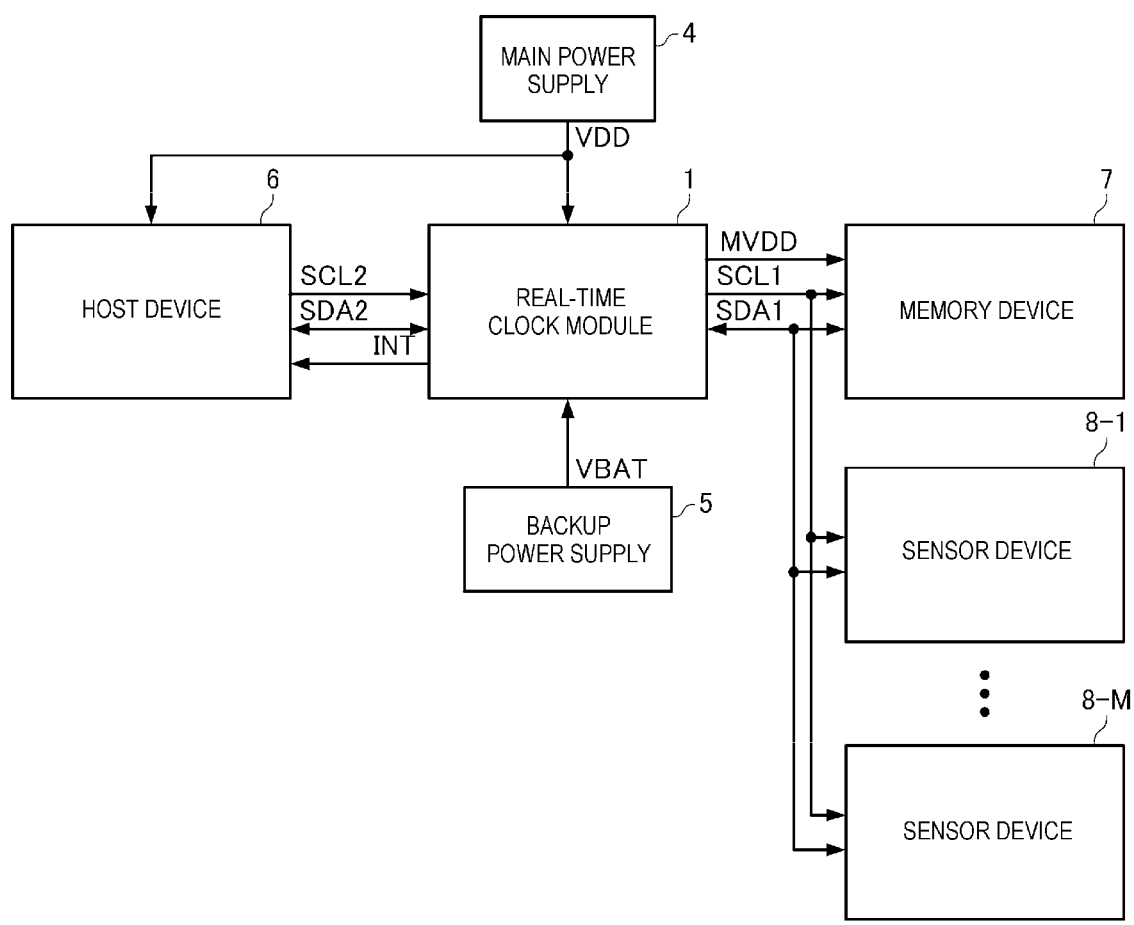
FIG. 6 is a diagram showing a configuration example of a system including a real-time clock module according to a second embodiment.

FIG. 6 is a diagram showing a configuration example of a system including the real-time clock module 1 according to the second embodiment.

As shown in FIG. 6, the real-time clock module 1 according to the second embodiment is coupled to the main power supply 4, the backup power supply 5, the host device 6, the memory device 7, and M sensor devices 8-1 to 8-M. M is an integer of 1 or more.

Similarly to the first embodiment, the real-time clock module 1 is supplied with the power supply voltage VDD from the main power supply 4 and supplied with the power supply voltage VBAT from the backup power supply 5. The real-time clock module 1 operates at the power supply voltage VDD when the power supply voltage VDD is supplied from the main power supply 4, and operates at the power supply voltage VBAT when the supply of the power supply voltage VDD from the main power supply 4 is cut off. Therefore, the real-time clock module 1 can continue a timing operation even while the supply of the power supply voltage VDD from the main power supply 4 is cut off.

Similarly to the first embodiment, the host device 6 operates by being supplied with the power supply voltage VDD from the main power supply 4. The host device 6 and the real-time clock module 1 communicate with each other via the I²C bus with the host device 6 as a master and the real-time clock module 1 as a slave.

The memory device 7 is, for example, a nonvolatile memory such as an EEPROM, and operates by being supplied with the power supply voltage MVDD from the real-time clock module 1. The sensor devices 8-1 to 8-M are, for example, temperature sensors, position information sensors, and inertial sensors. The real-time clock module 1, the memory device 7, and the sensor devices 8-1 to 8-M communicate with each other via the common I²C bus with the real-time clock module 1 as a master and the memory device 7 and the sensor devices 8-1 to 8-M as slaves.

Figure 7:
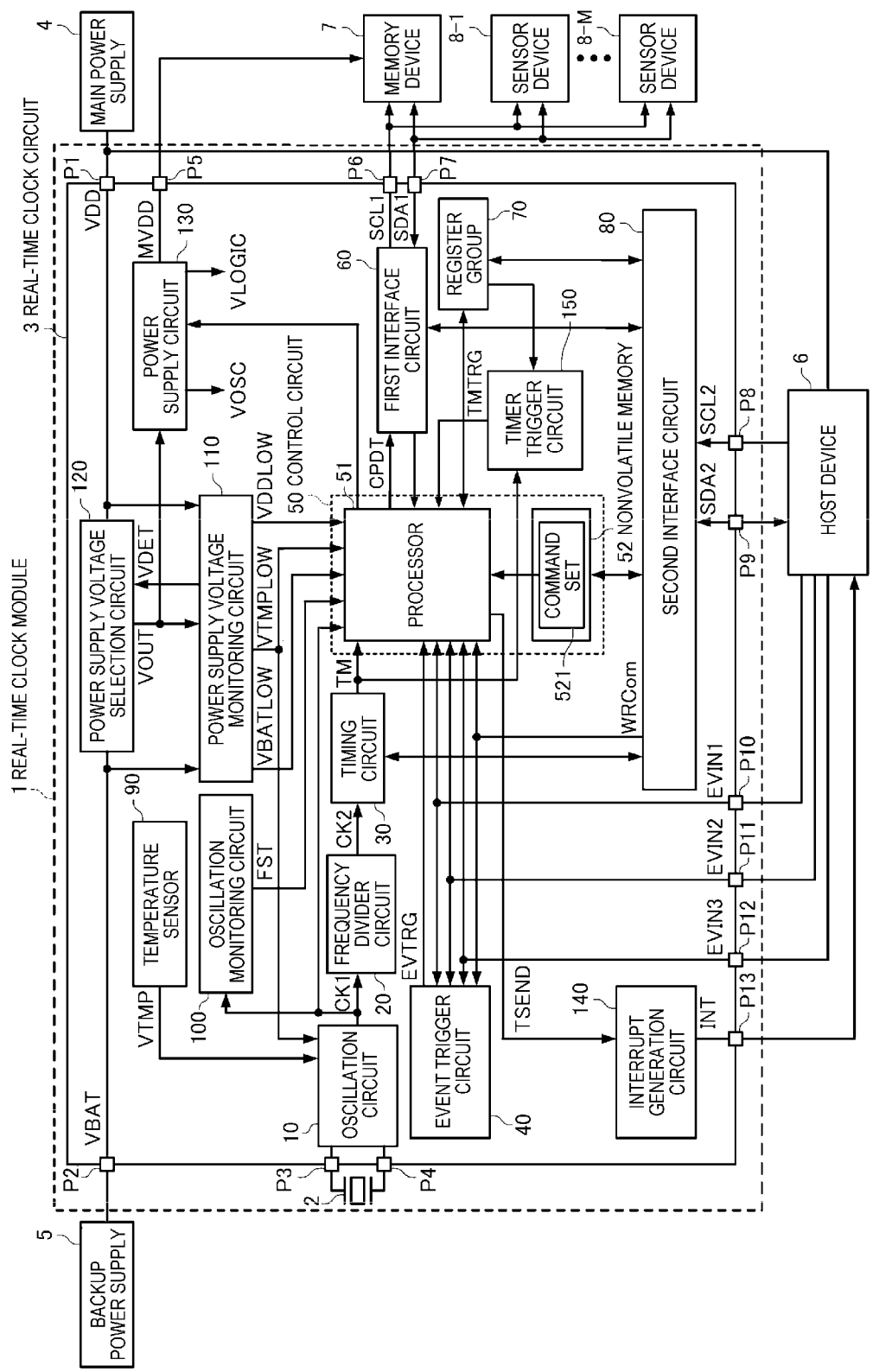
FIG. 7 is a functional block diagram of the real-time clock module according to the second embodiment.

FIG. 7 is a functional block diagram of the real-time clock module 1 according to the second embodiment. As shown in FIG. 7, the real-time clock module 1 according to the second embodiment is different from the real-time clock module 1 according to the first embodiment in that the sensor devices 8-1 to 8-M are coupled to the real-time clock module 1 and the real-time clock circuit 3 includes a timer trigger circuit 150.

In the second embodiment, the first interface circuit 60 is an interface circuit for communication among the real-time clock module 1, the memory device 7, and the sensor devices 8-1 to 8-M. In the communication by the first interface circuit 60, the real-time clock module 1 is a master, and the memory device 7 and the sensor devices 8-1 to 8-M are slaves. That is, the first interface circuit 60 functions as a master interface for the memory device 7 and the sensor devices 8-1 to 8-M. The first interface circuit 60 is an interface circuit compatible with the I²C bus, and communicates with the memory device 7 and the sensor devices 8-1 to 8-M based on the serial clock signal SCL1 output via the terminal P6 of the real-time clock circuit 3 and the serial data signal SDA1 input and output via the terminal P7 of the real-time clock circuit 3.

Similarly to the first embodiment, the first interface circuit 60 transmits a command, according to an instruction from the processor 51, to the memory device 7 via the terminals P6 and P7. The memory device 7 receives the command and performs various types of processing according to the command. For example, the first interface circuit 60 performs processing of sequentially acquiring, for example, 8-bit data constituting the capture data CPDT output from the control circuit 50 and writing the data in the memory device 7.

Further, in the second embodiment, the first interface circuit 60 transmits a command, according to an instruction of the processor 51, to the sensor devices 8-1 to 8-M via the terminals P6 and P7. The sensor devices 8-1 to 8-M receive the command and perform various types of processing according to the command.

In particular, in the embodiment, the first interface circuit 60 transmits a command for requesting transmission of detected data to a sensor device 8-i according to an instruction of the processor 51. The sensor device 8-i receives the command and transmits the detected data to the first interface circuit 60. The first interface circuit 60 receives data detected by the sensor device 8-i, and transmits the received data to the processor 51. i is an integer of 1 or more and M or less.

The power supply voltage VLOGIC is supplied to the timer trigger circuit 150. Based on the time data TM, the timer trigger circuit 150 outputs a timer trigger signal TMTRG having a high pulse each time a time, which is determined by control time data set in a timer setting register included in the register group 70, elapses. That is, the timer trigger circuit 150 repeatedly outputs the timer trigger signal TMTRG having a high pulse at a timing determined by the control time data.

The control time data is set in advance in the timer setting register by the host device 6. That is, the second interface circuit 80 receives the control time data transmitted from the host device 6, and sets the received control time data in the timer setting register.

The control circuit 50 controls the power supply circuit 130 to start the supply of the power supply voltage MVDD to the memory device 7 at a timing determined by the control time data set in the timer setting register. Specifically, in order to reduce power consumption, the processor 51 returns from the sleep state at the timing determined by the control time data and starts the supply of the power supply voltage MVDD to the memory device 7.

After starting the supply of the power supply voltage MVDD to the memory device 7, the control circuit 50 writes target time data corresponding to at least a part of time digits of the time data TM to the memory device 7 via the first interface circuit 60. In the second embodiment, the control circuit 50 acquires the data detected by the sensor devices 8-1 to 8-M via the first interface circuit 60 after starting the supply of the power supply voltage MVDD to the memory device 7, and writes sensor data including the acquired data to the memory device 7 via the first interface circuit 60. That is, the control circuit 50 writes the capture data CPDT including the target time data and the sensor data to the memory device 7.

For example, one of the sensor devices 8-1 to 8-M may be a temperature sensor, and the sensor data may include temperature data. In this case, a temperature compensation circuit included in the oscillation circuit 10 may use data detected by the temperature sensor, which is one of the sensor devices 8-1 to 8-M, instead of the temperature signal VTMP output from the temperature sensor 90. For example, one of the sensor devices 8-1 to 8-M may be a position information sensor, and the sensor data may include position data. The position information sensor may be, for example, a GPS sensor. GPS is an abbreviation for a global positioning system or a global positioning satellite. For example, one of the sensor devices 8-1 to 8-M may be an inertial sensor, and the sensor data may include inertial data. For example, the inertial sensor may be an acceleration sensor, and the inertial data may be acceleration data. For example, the inertial sensor may be an angular velocity sensor, and the inertial data may be angular velocity data. For example, the inertial sensor may be an IMU, and the inertial data may be data including acceleration data and angular velocity data. IMU is an abbreviation for an inertial measurement unit.

After performing the time stamp processing of writing the capture data CPDT including the target time data and the sensor data to the memory device 7, the control circuit 50 controls the power supply circuit 130 to stop the supply of the power supply voltage MVDD to the memory device 7.

Figures 8, 9:
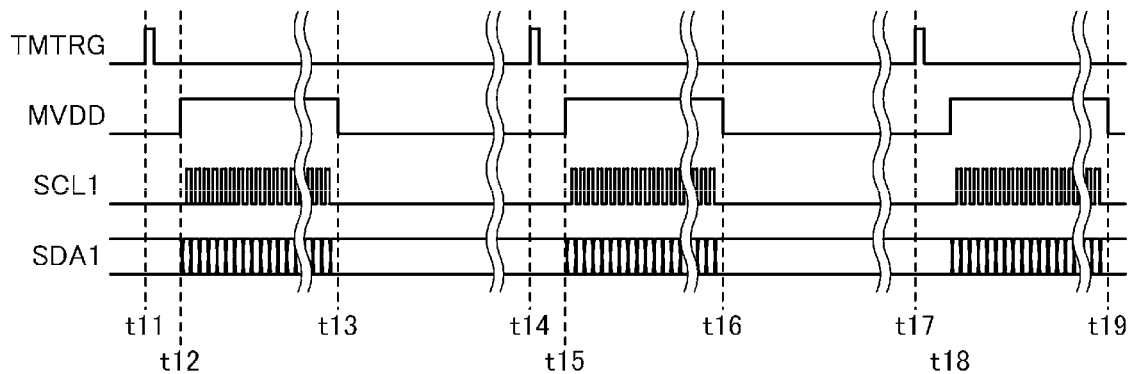
FIG. 8 is a timing chart showing an example of time stamp processing based on a timer trigger signal, which is performed by a control circuit.
FIG. 9 is a diagram showing an example of capture data in the second embodiment.

FIG. 8 is a timing chart showing an example of time stamp processing based on the timer trigger signal TMTRG, which is performed by the control circuit 50. In the example of FIG. 8, the timer trigger signal TMTRG changes from a low level to a high level at a time t11, and the control circuit 50 starts the supply of the power supply voltage MVDD from the power supply circuit 130 to the memory device 7 at a time t12. Next, in a period of time t12 to t13, the control circuit 50 continues the supply of the power supply voltage MVDD from the power supply circuit 130 to the memory device 7, and writes the capture data CPDT including the target time data and the sensor data to the memory device 7 via the first interface circuit 60. Then, at the time t13 after the end of the writing of the capture data CPDT to the memory device 7, the control circuit 50 stops the supply of the power supply voltage MVDD from the power supply circuit 130 to the memory device 7.

Next, the timer trigger signal TMTRG changes from the low level to the high level at a time t14 when a time based on the control time data has elapsed from the time t11, and the control circuit 50 starts the supply of the power supply voltage MVDD from the power supply circuit 130 to the memory device 7 at a time t15. Next, in a period of time t15 to t16, the control circuit 50 continues the supply of the power supply voltage MVDD from the power supply circuit 130 to the memory device 7, and writes the capture data CPDT including the target time data and the sensor data to the memory device 7 via the first interface circuit 60. Then, at the time t16 after the end of the writing of the capture data CPDT to the memory device 7, the control circuit 50 stops the supply of the power supply voltage MVDD from the power supply circuit 130 to the memory device 7.

Next, the timer trigger signal TMTRG changes from the low level to the high level at a time t17 when a time based on the control time data has elapsed from the time t14, and the control circuit 50 starts the supply of the power supply voltage MVDD from the power supply circuit 130 to the memory device 7 at a time t18. Next, in a period of time t18 to t19, the control circuit 50 continues the supply of the power supply voltage MVDD from the power supply circuit 130 to the memory device 7, and writes the capture data CPDT including the target time data and the sensor data to the memory device 7 via the first interface circuit 60. Then, at the time t19 after the end of the writing of the capture data CPDT to the memory device 7, the control circuit 50 stops the supply of the power supply voltage MVDD from the power supply circuit 130 to the memory device 7.

Returning to the description of FIG. 7, in the second embodiment, similarly to the first embodiment, in response to the generation of an event, the control circuit 50 also starts the supply of the power supply voltage MVDD to the memory device 7, selects at least one of the plurality of types of event data as target event data, selects target time data corresponding to at least a part of the time digits of the time data TM generated by the timing circuit 30, and causes the memory device 7 to store the capture data CPDT including the target time data and the target event data via the first interface circuit 60. Then, the control circuit 50 stops the supply of the power supply voltage MVDD to the memory device 7 after writing the capture data CPDT to the memory device 7.

The timing chart showing the example of the time stamp processing based on the event trigger signal EVTRG, which is performed by the control circuit 50, may be the same as that of FIG. 3, and thus illustration and description thereof will be omitted.

Similarly to the first embodiment, the plurality of types of event data may include the first power supply voltage drop signal VDDLOW, the second power supply voltage drop signal VBATLOW, the third power supply voltage drop signal VTMPLOW, the oscillation stop signal FST, the first event signal EVIN1, the second event signal EVIN2, the third event signal EVIN3, and the event command detection signal WRCom. Further, in the second embodiment, the plurality of types of event data may further include the sensor data based on the data detected by the sensor devices 8-1 to 8-M.

FIG. 9 is a diagram showing an example of the capture data CPDT stored in the memory device 7 in the second embodiment. In the example of FIG. 9, the capture data CPDT is 64-bit data, and is stored in, for example, the addresses 0x0 to 0x7 of the memory device 7.

Specifically, at the address 0x0 of the memory device 7, 0 is stored in the bit 7, and 7-bit second data included in the time data TM is stored in the bits 6 to 0.

At the address 0x1 of the memory device 7, 0 is stored in the bit 7, and 7-bit minute data included in the time data TM is stored in the bits 6 to 0.

At the address 0x2 of the memory device 7, 0 is stored in the bits 7 and 6, and 6-bit hour data included in the time data TM is stored in the bits 5 to 0.

At the address 0x3 of the memory device 7, 0 is stored in the bits 7 and 6, and 6-bit day data included in the time data TM is stored in the bits 5 to 0.

At the address 0x4 of the memory device 7, data corresponding to the logic level of the third event signal EVIN3 is stored in the bit 7, data corresponding to the logic level of the second event signal EVIN2 is stored in the bit 6, data corresponding to the logic level of the first event signal EVIN1 is stored in the bit 5, and 5-bit month data included in the time data TM is stored in the bits 4 to 0.

At the address 0x5 of the memory device 7, 8-bit year data included in the time data TM is stored in the bits 7 to 3.

At the address 0x6 of the memory device 7, upper 8-bit data of the sensor data is stored in the bits 7 to 0.

At the address 0x7 of the memory device 7, lower 8-bit data of the sensor data is stored in the bits 7 to 0.

In the example of FIG. 9, the second data, the minute data, the hour data, the day data, the month data, and the year data are the target time data, and all the other data are the target event data.

Returning to the description of FIG. 7, when the time stamp processing based on the timer trigger signal TMTRG or the time stamp processing based on the event trigger signal EVTRG ends, the processor 51 outputs the time stamp end signal TSEND to the interrupt generation circuit 140.

The interrupt generation circuit 140 generates the interrupt signal INT based on the time stamp end signal TSEND, and outputs the interrupt signal INT to the host device 6 via the terminal P13 of the real-time clock circuit 3. When receiving the interrupt signal INT, the host device 6 performs predetermined interrupt processing. For example, the host device 6 transmits a command for requesting data reading of a time stamp to the real-time clock module 1, and receives the capture data CPDT stored in the memory device 7 from the real-time clock module 1.

In order to reduce the power consumption of the entire system, the host device 6 shifts to the sleep state when the processing is not performed, returns from the sleep state to perform processing of reading the data of the time stamp when receiving the interrupt signal INT in the sleep state, and shifts to the sleep state again when necessary processing ends.

According to the real-time clock module 1 of the second embodiment described above, it is possible to achieve the same effects as those of the real-time clock module 1 of the first embodiment.

Further, according to the real-time clock module 1 of the second embodiment, since the control circuit 50 starts the supply of the power supply voltage MVDD to the memory device 7 at the timing determined by the control time data, the timing at which the capture data CPDT is written to the memory device 7 can be controlled by the control time data. Further, since the host device 6 can set the control time data via the second interface circuit 80, the timing at which the capture data CPDT is written to the memory device 7 can be changed.

In the real-time clock module 1 according to the second embodiment, the processor 51 of the control circuit 50 returns from the sleep state at the timing determined by the control time data and starts the supply of the power supply voltage MVDD to the memory device 7. That is, according to the real-time clock module 1 of the second embodiment, since the processor 51 is in the sleep state before the capture data CPDT is written to the memory device 7, the power consumption is reduced.

In the real-time clock module 1 according to the second embodiment, the control circuit 50 can acquire the data detected by the sensor devices 8-1 to 8-M, and cause the memory device 7 to store the capture data CPDT including the sensor data based on the acquired data and the target time data.

1-3. Modification

For example, in the above-described embodiments, the target time data and the target event data selected by the control circuit 50 is the same regardless of the generation factors of the event trigger signal EVTRG, and may be different for each generation factor of the event trigger signal EVTRG.

For example, in the above-described embodiments, the processor 51 in the control circuit 50 performs software processing based on the command set 521, and thus the target time data and the target event data can be freely selected. The control circuit 50 may be implemented as hardware that selects the target time data and the target event data based on selection data freely set in a predetermined register included in the nonvolatile memory 52 or the register group 70.

For example, in the above-described embodiments, the command set 521 specifies the target time data and the target event data, and the target event data may be specified without specifying the target time data. That is, the type of the target time data selected by the control circuit 50 may be fixed and the target time data may not be selected by the command set 521, and the target event data may be freely selected by the command set 521.

For example, in the second embodiment, the control circuit 50 performs the time stamp processing based on the timer trigger signal TMTRG and the time stamp processing based on the event trigger signal EVTRG. Either one of the processing may not be performed. In the second embodiment, the control circuit 50 is coupled to the sensor devices 8-1 to 8-M, and may not be coupled to the sensor devices 8-1 to 8-M.

2. Electronic Device

Figure 10:
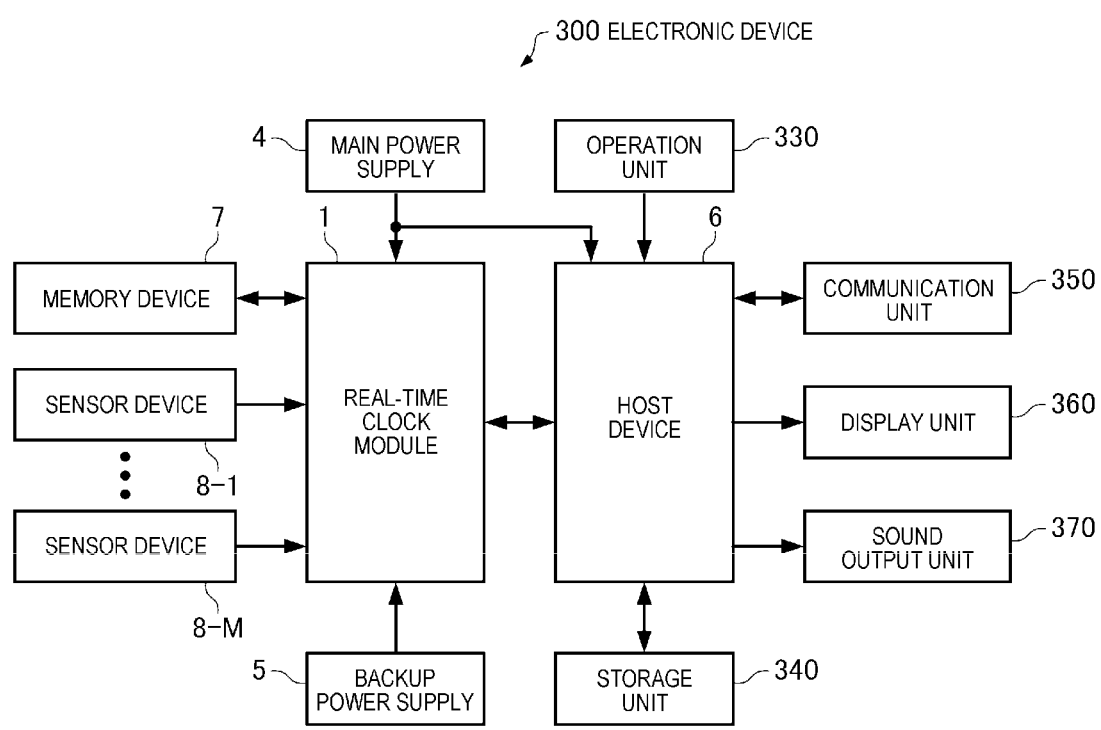
FIG. 10 is a functional block diagram of an electronic device.

FIG. 10 is a functional block diagram of an electronic device including the real-time clock module 1 and the memory device 7 according to any one of the above-described embodiments.

As shown in FIG. 10, an electronic device 300 according to the embodiment includes the real-time clock module 1, the main power supply 4, the backup power supply 5, the host device 6, the memory device 7, the sensor devices 8-1 to 8-M, an operation unit 330, a storage unit 340, a communication unit 350, a display unit 360, and a sound output unit 370. In the electronic device 300 according to the embodiment, some of components in FIG. 10 may be omitted or changed, or other components may be added.

The real-time clock module 1, the main power supply 4, the backup power supply 5, the host device 6, the memory device 7, and the sensor devices 8-1 to 8-M have the same configurations and functions as those in the embodiments described above, and thus are denoted by the same reference numerals.

The real-time clock module 1 is supplied with the power supply voltage VDD from the main power supply 4 and supplied with the power supply voltage VBAT from the backup power supply 5. The real-time clock module 1 operates at the power supply voltage VDD when the power supply voltage VDD is supplied from the main power supply 4, and operates at the power supply voltage VBAT when the supply of the power supply voltage VDD from the main power supply 4 is cut off. Therefore, the real-time clock module 1 can continue a timing operation even while the supply of the power supply voltage VDD from the main power supply 4 is cut off.

The host device 6 operates by being supplied with the power supply voltage VDD from the main power supply 4. The host device 6 and the real-time clock module 1 communicate with each other with the host device 6 as a master and the real-time clock module 1 as a slave. The host device 6 is implemented by, for example, an MCU or an MPU.

The memory device 7 is, for example, a nonvolatile memory such as an EEPROM, and operates by being supplied with the power supply voltage MVDD from the real-time clock module 1. The sensor devices 8-1 to 8-M are, for example, temperature sensors, position information sensors, and inertial sensors. The real-time clock module 1, the memory device 7, and the sensor devices 8-1 to 8-M communicate with each other with the real-time clock module 1 as a master and the memory device 7 and the sensor devices 8-1 to 8-M as slaves.

As described above, the real-time clock module 1 performs processing of generating the time data TM, processing of acquiring data detected by the sensor devices 8-1 to 8-M, time stamp processing of causing the memory device 7 to store the capture data CPDT, and the like.

The host device 6 performs various types of calculation processing and control processing according to a program stored in the storage unit 340 and the like. Specifically, the host device 6 performs various types of processing according to an operation signal from the operation unit 330, processing of controlling the communication unit 350 to perform data communication with other devices, processing of transmitting a display signal for displaying various types of information on the display unit 360, processing of transmitting a sound signal for outputting various sounds from the sound output unit 370, and the like.

The host device 6 communicates with the real-time clock module 1, reads the time data TM from the real-time clock module 1, and performs various types of the calculation processing and the control processing. The host device 6 rewrites the time data TM for the real-time clock module 1, and the like. The host device 6 reads the capture data CPDT stored in the memory device 7 via the real-time clock module 1, and performs various types of the calculation processing and the control processing.

The operation unit 330 is an input device including operation keys, button switches, and the like, and outputs, to the host device 6, an operation signal corresponding to an operation by a user. The host device 6 can set time information in the real-time clock module 1 according to, for example, a signal received from the operation unit 330.

The storage unit 340 stores programs, data, and the like for the host device 6 to perform various types of the calculation processing and the control processing. The storage unit 340 is used as a work area of the host device 6, and temporarily stores programs and data read from the storage unit 340, data received from the operation unit 330, operation results executed by the host device 6 according to various programs, and the like. The storage unit 340 includes a ROM and a RAM, and is implemented by, for example, a hard disk, a flexible disk, an MO, an MT, various memories, a CD-ROM, a DVD-ROM, and the like. ROM is an abbreviation for a read only memory, and RAM is an abbreviation for a random access memory.

The communication unit 350 performs various controls for establishing data communication between the host device 6 and an external device. The data communication may be wireless communication or wired communication.

The display unit 360 is a display device implemented by an LCD and the like, and displays various types of information based on the display signal received from the host device 6. The display unit 360 may be provided with a touch panel that functions as the operation unit 330. LCD is an abbreviation for a liquid crystal display.

The sound output unit 370 includes a speaker and the like, and outputs various types of information as sound or voice based on the sound signal received from the host device 6.

The electronic device 300 according to the embodiment includes the real-time clock module 1 according to any one of the above-described embodiments, thereby achieving low power consumption.

Various electronic devices are conceivable as such an electronic device 300, and examples thereof include a data logger, a wireless device for IoT use, an electronic timepiece, a personal computer such as mobile type, laptop type, and tablet type, a mobile terminal such as a smartphone and a mobile telephone, a digital camera, an ink jet type discharge device such as an ink jet printer, a storage area network device such as a router and a switch, a local area network device, a mobile terminal base station device, a television, a video camera, a video recorder, a car navigation device, a real-time clock device, a pager, an electronic notebook, an electronic dictionary, a calculator, an electronic game device, a game controller, a word processor, a work station, a television telephone, a security television monitor, an electronic binocular, a POS terminal, a medical device such as an electronic thermometer, a blood pressure meter, a blood sugar meter, an electrocardiogram measuring device, an ultrasonic diagnostic device, and an electronic endoscope, a fish finder, various measuring devices, measuring instruments of a vehicle, an aircraft, a ship, and the like, a flight simulator, a head-mounted display, a motion trace, a motion tracking, a motion controller, and a pedestrian self-contained navigation device.

The present disclosure is not limited to the embodiments, and various modifications can be made within the scope of the gist of the present disclosure.

The embodiments and the modifications described above are merely examples, and the present disclosure is not limited thereto. For example, the embodiments and the modifications can be combined as appropriate.

The present disclosure includes a configuration substantially the same as the configurations described in the embodiments (for example, a configuration having the same functions, methods, and results, or a configuration having the same purposes and effects). The present disclosure includes a configuration obtained by replacing a non-essential portion of the configuration described in the embodiments. The present disclosure includes a configuration having the same functions and effects as the configuration described in the embodiments, or a configuration capable of achieving the same purpose. The present disclosure includes a configuration in which a known technique is added to the configuration described in the embodiments.

The following contents are derived from the above embodiments and modifications.

A real-time clock module according to one aspect is a real-time clock module coupled to a memory device, and the real-time clock module includes:
    a timing circuit configured to measure a time to generate time data;
    a first interface circuit configured to function as a master interface for the memory device;
    a power supply circuit configured to supply a power supply voltage to the memory device; and
    a control circuit configured to write, to the memory device, target time data corresponding to at least a part of time digits of the time data via the first interface circuit after the supply of the power supply voltage to the memory device is started, and to stop the supply of the power supply voltage to the memory device after the target time data is written to the memory device.

According to the real-time clock module, the supply of the power supply voltage to the memory device is started before the target time data is written to the memory device, and the supply of the power supply voltage to the memory device is stopped after the target time data is written to the memory device, and therefore, the power consumption of the memory device can be reduced.

The real-time clock module according to one aspect may further include:
    a register configured to store control time data, in which the control circuit may be configured to start the supply of the power supply voltage to the memory device at a timing determined by the control time data.

According to the real-time clock module, the timing at which the target time data is written to the memory device can be controlled by the control time data.

In the real-time clock module according to one aspect, the control circuit may include a processor, and the processor may be configured to return from a sleep state at the timing and to start the supply of the power supply voltage to the memory device.

According to the real-time clock module, since the processor is in the sleep state before writing the target time data to the memory device, the power consumption is reduced.

The real-time clock module according to one aspect may further include:

a second interface circuit configured to receive the control time data as a slave interface.

According to the real-time clock module, the timing at which the target time data is written to the memory device can be changed from the outside.

In the real-time clock module according to one aspect,
in response to generation of an event, the control circuit may be configured to select at least one of a plurality of types of event data as target event data to be stored, and to write the target event data to the memory device.

According to the real-time clock module, since the target event data selected from the plurality of types of event data together with the target time data is stored in the memory device in response to the generation of the event, unnecessary event data for each application in the time stamp can be prevented from being stored.

The real-time clock module according to one aspect may be coupled to a sensor device, and
the control circuit may be configured to write, to the memory device, sensor data based on data detected by the sensor device.

According to the real-time clock module, the sensor data together with the target time data can be stored in the memory device.

The real-time clock module according to one aspect may further include:
a resonator; and
an oscillation circuit configured to generate a clock signal by oscillating the resonator, in which
the timing circuit may be configured to measure the time based on the clock signal.

According to the real-time clock module, it is possible to measure the time based on a highly accurate clock signal acquired by oscillating the resonator.

An electronic device according to one aspect includes:
the real-time clock module according to the above aspect; and
the memory device.

The electronic device includes the real-time clock module capable of reducing the power consumption of the memory device to which the time data is written, thereby reducing the power consumption as a whole.

What is claimed is:
1. A real-time clock module coupled to a memory device, the real-time clock module comprising:
a timing circuit configured to measure a time to generate time data;
a first interface circuit configured to function as a master interface for the memory device;
a power supply circuit configured to supply a power supply voltage to the memory device; and
a control circuit configured to write, to the memory device, target time data corresponding to at least a part of time digits of the time data via the first interface circuit after the supply of the power supply voltage to the memory device is started, and to stop the supply of the power supply voltage to the memory device after the target time data is written to the memory device.

2. The real-time clock module according to claim 1, further comprising:
a register configured to store control time data, wherein
the control circuit is configured to start the supply of the power supply voltage to the memory device at a timing determined by the control time data.

3. The real-time clock module according to claim 2, wherein
the control circuit includes a processor, and
the processor is configured to return from a sleep state at the timing and to start the supply of the power supply voltage to the memory device.

4. The real-time clock module according to claim 2, further comprising:
a second interface circuit configured to receive the control time data as a slave interface.

5. The real-time clock module according to claim 1, wherein
in response to generation of an event, the control circuit is configured to select at least one of a plurality of types of event data as target event data to be stored, and to write the target event data to the memory device.

6. The real-time clock module according to claim 1, wherein
the real-time clock module is coupled to a sensor device, and
the control circuit is configured to write, to the memory device, sensor data based on data detected by the sensor device.

7. The real-time clock module according to claim 1, further comprising:
a resonator; and
an oscillation circuit configured to generate a clock signal by oscillating the resonator, wherein
the timing circuit is configured to measure the time based on the clock signal.

8. An electronic device comprising:
the real-time clock module according to claim 1; and
the memory device.

* * * * *